(12) United States Patent
Dyott

(10) Patent No.: US 6,535,657 B2
(45) Date of Patent: Mar. 18, 2003

(54) POLARIZATION TRANSFORMER

(75) Inventor: Richard B. Dyott, Oak Lawn, IL (US)

(73) Assignee: KVH Industries, Inc., Middletown, RI (US)

(*) Notice: Subject to any disclaimer, the term of this patent is extended or adjusted under 35 U.S.C. 154(b) by 0 days.

(21) Appl. No.: 10/147,148

(22) Filed: May 16, 2002

(65) Prior Publication Data

US 2002/0136480 A1 Sep. 26, 2002

Related U.S. Application Data

(63) Continuation of application No. 09/337,223, filed on Jun. 22, 1999, now abandoned.
(60) Provisional application No. 60/119,999, filed on Feb. 11, 1999, provisional application No. 60/120,000, filed on Feb. 11, 1999, provisional application No. 60/133,357, filed on May 10, 1999, and provisional application No. 60/134,154, filed on May 14, 1999.

(51) Int. Cl.[7] .................................................. G02B 6/00
(52) U.S. Cl. ............................. 385/11; 385/12; 385/123
(58) Field of Search ........................... 385/11, 12, 123

(56) References Cited

U.S. PATENT DOCUMENTS

| | | | |
|---|---|---|---|
| 4,571,650 A | 2/1986 | Ojima et al. | |
| 4,603,931 A | 8/1986 | Ruffman | |
| 4,615,582 A | 10/1986 | Lefevre et al. | |
| 4,630,229 A | 12/1986 | D'Hondt | |
| 4,630,890 A | 12/1986 | Ashkin et al. | |
| 4,637,722 A | 1/1987 | Kim | |
| 4,668,264 A | 5/1987 | Dyott | |
| 4,669,814 A | 6/1987 | Dyott | |
| 4,697,876 A | 10/1987 | Dyott | |
| 4,712,866 A | 12/1987 | Dyott | |
| 4,733,938 A | 3/1988 | Lefevre et al. | |
| 4,740,085 A | 4/1988 | Lim | |
| 4,755,021 A | 7/1988 | Dyott | |
| 4,756,589 A | * 7/1988 | Bricheno et al. | 350/96.15 |
| 4,765,739 A | 8/1988 | Koizumi et al. | |
| 4,776,700 A | 10/1988 | Frigo | |
| 4,796,993 A | 1/1989 | Sonobe et al. | |
| 4,815,817 A | 3/1989 | Levinson | |
| 4,842,409 A | 6/1989 | Arditty et al. | |
| 4,848,910 A | 7/1989 | Dupraz | |
| 4,883,358 A | 11/1989 | Okada | |
| 4,887,900 A | 12/1989 | Hall | |
| 4,943,132 A | 7/1990 | Huang | |

(List continued on next page.)

FOREIGN PATENT DOCUMENTS

| | | |
|---|---|---|
| DE | 33 05 104 A1 | 8/1984 |
| DE | 36 15 305 A1 | 11/1987 |
| DE | 37 42 201 A1 | 6/1989 |

(List continued on next page.)

OTHER PUBLICATIONS

US 6,208,775, 3/2001, Dyott (withdrawn)
Alekseev et al; "Fiber Optic Gyroscope With Suppression of Excess Noise From the Radiation Source", Technical Physical Letters, 24(9): 719–721, (Sep. 1998).

(List continued on next page.)

Primary Examiner—Akm E. Ullah
Assistant Examiner—Jennifer Doan
(74) Attorney, Agent, or Firm—Foley Hoag LLP

(57) ABSTRACT

A method for fabricating a transformer of linearly polarized light to elliptically polarized light is presented. The method involves twisting a birefringent fiber through angles that depend on the polarization desired. This technique obviates the need to splice fibers, as in common approaches. In the final step of the method, the polarization can be fine tuned by heating the fiber to cause the core of the fiber to diffuse into the cladding. Also, methods and systems are presented to transform substantially polarized light to substantially randomly polarized light.

80 Claims, 3 Drawing Sheets

U.S. PATENT DOCUMENTS

| | | |
|---|---|---|
| 5,033,854 A | 7/1991 | Matthews et al. |
| 5,048,962 A | 9/1991 | Kurokawa et al. |
| 5,074,665 A | 12/1991 | Huang et al. |
| 5,080,489 A | 1/1992 | Nishikawa et al. |
| 5,096,312 A | 3/1992 | Huang |
| 5,106,193 A | 4/1992 | Fesler et al. |
| 5,133,600 A | 7/1992 | Schröder |
| 5,135,555 A | 8/1992 | Coyle, Jr. et al. |
| 5,289,257 A | 2/1994 | Kurokawa et al. |
| 5,289,258 A | 2/1994 | Szafraniec et al. |
| 5,331,404 A | 7/1994 | Moeller et al. |
| 5,351,123 A | 9/1994 | Spahlinger |
| 5,359,413 A | 10/1994 | Chang et al. |
| 5,365,338 A | 11/1994 | Bramson |
| 5,412,471 A | 5/1995 | Tada et al. |
| 5,459,575 A | 10/1995 | Malvern |
| 5,469,257 A | 11/1995 | Blake et al. |
| 5,469,267 A | 11/1995 | Wang |
| 5,471,301 A | 11/1995 | Kumagai et al. |
| 5,493,396 A | 2/1996 | Sewell |
| 5,500,909 A | 3/1996 | Meier |
| 5,504,684 A | 4/1996 | Lau et al. |
| 5,552,887 A | 9/1996 | Dyott |
| 5,559,908 A | 9/1996 | August et al. |
| 5,644,397 A | 7/1997 | Blake |
| 5,654,906 A | 8/1997 | Youngquist |
| 5,655,035 A | 8/1997 | Burmenko |
| 5,682,241 A | 10/1997 | Mark et al. |
| 5,701,177 A | 12/1997 | Kumagai et al. |
| 5,701,376 A | 12/1997 | Shirasaki |
| 5,767,509 A | 6/1998 | Cardova et al. |
| 5,781,675 A | 7/1998 | Tseng et al. |
| 5,854,864 A | 12/1998 | Knoesen et al. |
| 5,898,496 A | 4/1999 | Huang et al. |
| 5,946,097 A | 8/1999 | Sanders et al. |
| 5,953,121 A | 9/1999 | Bohnert et al. |
| 5,987,195 A | 11/1999 | Blake |
| 6,023,331 A | 2/2000 | Blake et al. |
| 6,025,915 A | 2/2000 | Michal et al. |
| 6,047,095 A | 4/2000 | Knoesen et al. |
| 6,075,915 A | 6/2000 | Koops et al. |
| 6,148,131 A | 11/2000 | Geertman |
| 6,163,632 A | 12/2000 | Rickman et al. |
| 6,185,033 B1 | 2/2001 | Bosc et al. |
| 6,233,371 B1 | 5/2001 | Kim et al. |
| 6,301,400 B1 | 10/2001 | Sanders |
| 6,351,310 B1 | 2/2002 | Emge et al. |
| 6,370,289 B1 | 4/2002 | Bennett |
| 6,389,185 B1 * | 5/2002 | Meise et al. ............... 385/11 |
| 6,396,965 B1 * | 5/2002 | Anderson ............... 385/11 |

FOREIGN PATENT DOCUMENTS

| | | |
|---|---|---|
| EP | 0 551 874 A2 | 7/1993 |
| EP | 0 586 242 A1 | 3/1994 |
| EP | 0 686 867 A1 | 12/1995 |
| EP | 0 722 081 A2 | 7/1996 |
| EP | 856 737 A1 | 8/1998 |
| EP | 0 871 009 A1 | 10/1998 |
| EP | 0 872 756 A1 | 10/1998 |
| FR | 2 535 463 A | 5/1984 |
| JP | 07209398 | 8/1995 |
| WO | WO98/58268 A | 12/1998 |
| WO | WO00/36425 | 6/2000 |

OTHER PUBLICATIONS

Blake et al., "In–Line Sagnac Interferometer Current Sensor," *IEEE*, pp. 116–121 (1995).

Blake and Szafraniec, "Random Noise in PM and Depolarized Fiber Gyros", OSA Symposium Proceedings, 1997, OWB2, pp. 122–125.

Bohnert. et al., "Field Test of Interferometric Optical Fiber High–Voltage and Current Sensors" *SPIE*, vol. 2360 pp. 16–19 (Feb. 1994).

Bohnert. et al., "Temperature and Vibration Insensitive Fiber–Optic Current Sensor" *ABB*, vol. 2360 pp. 336–339 (Feb. 1994).

Burns, et al., "Excess Noise in Fiber Gyroscope Sources ", IEEE Photonics Technology Letter, vol. 2, No. 8, Aug. 1990, pp. 606–608.

Clark et al., "Application of a PLL and ALL Noise Reduction Process in Optical Sensing System," *IEEE Translations on Industrial Electronics*, vol. 44, No. 1, Feb. 1997, pp. 136–138.

Dagenais et al., "Low–Frequency Intensity Noise Reduction for Fiber–Optic Sensor Applications," *Optical Fiber Sensors Conference*, 1992, Jan. 29–31, pp. 177–180.

Dupraz, J.P., "Fiber–Optic Interferometers for Current Measurement: Principles and Technology", Alsthom Review No. 9: 29–44 (Dec. 1987).

Frosio, G. and Dändliker, "Reciprocal Reflection Interferometer for a Fiber–Optic Faraday Current Sensor", Applied Optics 33 (25): 6111–6122 (Sep. 1, 1994).

Gronau Yuval et al.; "Digital Signal Processing For An Open–Loop Fiber–Optic Gyroscope", Applied Optics, Optical Society of America, Washington, U.S., vol. 34, No. 25, Sep. 1, 1995, pp. 5849–5853.

Killian M. Kevin; "Pointing Grade Fiber Optic Gyroscope", IEEE AES Systems Magazine, pp. 6–10 (Jul. 1994).

LaViolette and Bossler: "Phase Modulation Control for An Interferometric Fiber Optic Gyroscope", IEEE Plan 90, Position Location and Navigation Symposium, Las Vegas, (Mar. 20–23, 1990).

Lefevre, "The Fiber–Optic Gyroscope", Artech House, Boston, pp. 29–30 (1993).

McCallion and Shimazu; "Side–Polished Fiber Provides Functionality and Transparency", Laser Focus World, 34 (9): S19–S24, (Sep. 1, 1998).

Moeller and Burns, "1.06μm All–fiber Gyroscope with Noise Subtraction, Proceedings of the Conference on Optical Fiber Sensors", IEEE–OSA, Monterey, CA, 1992, pp. 82–85.

Moeller and Burns, "Observation of Thermal Noise in a Dynamically Biased Fiber–Optic Gyro", Optical Letters, 1996, vol. 21, pp. 171–173.

Nikos Drakos, "Circular Polarization States for Light, and Quarter–Wave Plates," *Computer Based Learning Unit, University of Leeds* (Mar. 2, 1998).

Ono et al.; "A Small –Sized, Compact, Open–loop Fibre-Optic Gyroscope with Stabilized Scale Factor", Meas. Sci. Technol. 1: 1078–1083, (1990.

Polynkin et al.; "All–Optical Noise–Subtraction Scheme for a Fiber–Optic Gyroscope", Optics Letters, 25(3): 147–149, (Feb. 1, 2000).

Rabelo et al.; "SNR Enhancement of Intensity Noise–Limited FOGs", Journal of Lightwave Technology 18(12):2146–2150 (Dec. 2000).

Short, S. et al., "Elimination of Birefringence Induced Scale Factor Errors in the In–Line Sagnac Interferometer Current Sensor", Journal of Lightwave Technology 16 (10): 1844–1850 (Oct. 1998).

* cited by examiner

POLARIZATION TRANSFORMER

This application is a continuation of U.S. patent application Ser. No. 09/337,223 filed on Jun. 22, 1999. This application is based upon and claims priority to the following U.S. patent applications: U.S. provisional patent application, serial application No. 60/119999, filed on Feb. 11, 1999; U.S. provisional patent application, serial application No. 60/120000, filed on Feb. 11, 1999; U.S. provisional patent application, serial application No. 60/133357, filed on May 10, 1999; and U.S. provisional patent application, serial application No. 60/134154, filed on May 14, 1999. This application is also based upon U.S. patent application Ser. No. 09/337,231, which was filed concurrently with U.S. patent application Ser. No. 09/337,223 on Jun. 22, 1999, now abandoned. All of the aforementioned applications are hereby incorporated by reference.

CROSS-REFERENCE TO RELATED APPLICATIONS

BACKGROUND OF THE INVENTION

1. Field of the Invention

This application relates to optical devices that transform light between linearly and elliptically polarized states.

2. Description of Related Art

Devices that transform linearly polarized light to circularly polarized light and the reverse are known in the literature. To make such optical devices, one may use one birefringent fiber with two beams of light of equal frequency and amplitude (or, equivalently, one beam that is the vector sum of these two beams). If the two beams are propagated perpendicular to the optic axis, circularly polarized light may result. Alternatively, linearly polarized light may be transformed to circularly polarized light by using one beam and two fibers.

In practice, constructing a single-beam transformer of linearly to circularly polarized light involves first starting with a length of transforming fiber greater than a predetermined length, and performing several iterations of cutting and measuring polarization until the polarization is deemed to be circular to within some specification. Needless to say, this is a tedious and lengthy procedure requiring lots of guesswork.

SUMMARY OF THE INVENTION

A method of fabricating a transformer of polarized light is presented herein, which can comprise twisting a birefringent fiber, having two ends, about its central axis through an angle approximately equal to an odd multiple of $\pi/4$ radians, at a distance of slightly more than a preselected multiple of a beatlength from a first end of the fiber, shining light substantially of a preselected first state of polarization through a preselected end of the fiber and fine tuning the polarization of the light exiting an end of the fiber opposite the preselected end by heating the fiber between the twist and the first end, so as to cause the core to diffuse into the cladding, until the exiting light can be substantially of a preselected second state of polarization. The birefringent fiber may be twisted while being, or after having been, heated near the location of the twist. The preselected first state of polarization may be linear, the preselected end of the fiber can be the second end, and the preselected second state of polarization may be elliptical with a preselected eccentricity or circular. Alternatively, the preselected first state of polarization may be elliptical with a preselected eccentricity or circular, the preselected end of the fiber can be the first end, and the preselected second state of polarization may be linear. The preselected multiple of a beatlength may be ¼. In one embodiment, the fiber may be twisted into a corkscrew shape.

A method of transforming substantially linearly polarized light into substantially elliptically polarized light may also be presented, which may comprise twisting a birefringent fiber, having two ends, through an angle approximately equal to an odd multiple of $\pi/4$ radians, at a distance of slightly more than a preselected multiple of a beatlength from a first end of the fiber, shining substantially linearly polarized light through a second end of the fiber and fine tuning the polarization of the light exiting the first end of the fiber by heating the fiber between the twist and the first end, so as to cause the core to diffuse into the cladding, until the exiting light can be substantially elliptically polarized with a preselected eccentricity. The elliptically polarized light may be circularly polarized. The preselected multiple of a beatlength may be an odd multiple of one quarter. The birefringent fiber may be twisted while being, or after having been heated near the location of the twist. In one embodiment, the fiber may be twisted into a corkscrew shape.

A method of transforming substantially elliptically polarized light into substantially linearly polarized light may also be presented, which can comprise twisting a birefringent fiber, having two ends, about its central axis through an angle approximately equal to an odd multiple of $\pi/4$ radians, at a distance of slightly more than a preselected multiple of a beatlength from a first end of the fiber, shining substantially elliptically polarized light with a preselected eccentricity through a first end of the fiber and fine tuning the polarization of the light exiting the second end of the fiber by heating the fiber between the twist and the first end, so as to cause the core to diffuse into the cladding, until the exiting light is substantially linearly polarized. The elliptically polarized light may be circularly polarized. The preselected multiple of a beatlength may be an odd multiple of one quarter. The birefringent fiber may be twisted while being, or after having been heated near the location of the twist. In one embodiment, the fiber may be twisted into a corkscrew shape.

A method of fabricating a transformer of polarized light may also be presented, which can comprise splicing a first end of a first birefringent fiber, having a central axis and two ends, to a second end of a second birefringent fiber, having a central axis and two ends, and having a length of slightly more than a preselected multiple of a beatlength, where the central axis of the second birefringent fiber can be rotated through an angle approximately equal to an odd multiple of $\pi/4$ radians with respect to the central axis of the first birefringent fiber, shining substantially linearly polarized light through the second end of the first fiber and fine tuning the polarization of the light exiting the first end of the second fiber by heating the second fiber, so as to cause the core to diffuse into the cladding, until the exiting light is substantially elliptically polarized with a preselected eccentricity. The preselected multiple of a beatlength may be an odd multiple of one quarter.

A method of fabricating a transformer of polarized light may also be presented, which may comprise splicing a first end of a first birefringent fiber, having a central axis and two ends, to a second end of a second birefringent fiber, having a central axis and two ends, and having a length of slightly more than a preselected multiple of a beatlength, where the central axis of the second birefringent fiber is rotated through an angle approximately equal to an odd multiple of π/4 radians with respect to the central axis of the first birefringent fiber, shining substantially elliptically polarized light through the first end of the second fiber and fine tuning the polarization of the light exiting the second end of the first fiber by heating the second fiber, so as to cause the core to diffuse into the cladding, until the exiting light is substantially linearly polarized. The preselected multiple of a beatlength may be an odd multiple of one quarter.

A method of transforming substantially linearly polarized light into substantially elliptically polarized light may also be presented, which can comprise splicing a first end of a first birefringent fiber, having a central axis and two ends, to a second end of a second birefringent fiber, having a central axis and two ends, and having a length of slightly more than a specified multiple of a beatlength, where the central axis of the second birefringent fiber is rotated through an angle approximately equal to an odd multiple of π/4 radians with respect to the central axis of the first birefringent fiber, shining substantially linearly polarized light through the second end of the first fiber and fine tuning the polarization of the light exiting the first end of the second fiber by heating the second fiber, so as to cause the core to diffuse into the cladding, until the exiting light is substantially elliptically polarized with a preselected eccentricity. The specified multiple of a beatlength may be an odd multiple of one quarter.

A method of transforming substantially elliptically polarized light into substantially linearly polarized light may also be presented, which can comprise splicing a first end of a first birefringent fiber, having a central axis and two ends, to a second end of a second birefringent fiber, having a central axis and two ends, and having a length of slightly more than a specified multiple of a beatlength, where the central axis of the second birefringent fiber is rotated through an angle approximately equal to an odd multiple of π/4 radians with respect to the central axis of the first birefringent fiber, shining substantially elliptically polarized light with a preselected eccentricity through the first end of the second fiber and fine tuning the polarization of the light exiting the second end of the first fiber by heating the second fiber, so as to cause the core to diffuse into the cladding, until the exiting light is substantially linearly polarized. The specified multiple of a beatlength may be an odd multiple of one quarter.

A transformer of light between substantially elliptical and substantially linear polarization states may be presented, which can comprise a birefringent fiber, having two ends, twisted about its central axis through an angle approximately equal to an odd multiple of π/4 radians, at a distance of slightly more than a preselected multiple of a beatlength from a first end of the fiber, wherein the fiber can contain a core which runs lengthwise through the fiber surrounded by a cladding and a portion of the core between the twist and a first end of the fiber can have diffused into a portion of the cladding surrounding it. The preselected multiple of a beatlength can be an odd multiple of one quarter. The portion of the core may diffuse into the portion of the cladding surrounding it by the application of heat to the portion of the fiber between the first end and the twist, which heat can be applied until substantially linearly polarized light entering a second end of the fiber can exit the first end substantially elliptically polarized with a preselected eccentricity, or, alternatively, until substantially elliptically polarized light with a preselected eccentricity entering a first end of the fiber can exit the second end substantially linearly polarized. The twist in the birefringent fiber may be formed by twisting the fiber while it may be being heated, or after it can have been heated near the location of the twist. The fiber may be twisted into a corkscrew shape.

A transformer of light between substantially linear and substantially elliptical polarization states may also be presented, which can comprise a first birefringent fiber, having a central axis and two ends, containing a core which runs lengthwise through the fiber surrounded by a cladding and a second birefringent fiber, having a central axis and two ends, containing a core which runs lengthwise through the fiber surrounded by a cladding, and having a length of slightly more than a preselected multiple of a beatlength, where the central axis of the second birefringent fiber may be rotated through an angle approximately equal to an odd multiple of π/4 radians with respect to the central axis of the first birefringent fiber, and the first end of the second birefringent fiber may be spliced to the second end of the first birefringent fiber, and where a portion of the core in the second fiber can have diffused into a portion of the cladding surrounding it. The preselected multiple of a beatlength may be an odd multiple of one quarter. The portion of the core may diffuse into the portion of the cladding surrounding it by the application of heat to the second fiber, which heat can be applied until substantially linearly polarized light entering a second end of the first fiber can exit the first end of the second fiber substantially elliptically polarized with a preselected eccentricity, or alternately, until substantially elliptically polarized light with a preselected eccentricity entering a first end of the second fiber can exit the second end of the first fiber substantially linearly polarized.

DETAILED DESCRIPTION OF THE PREFERRED EMBODIMENT(S)

Figure 1:
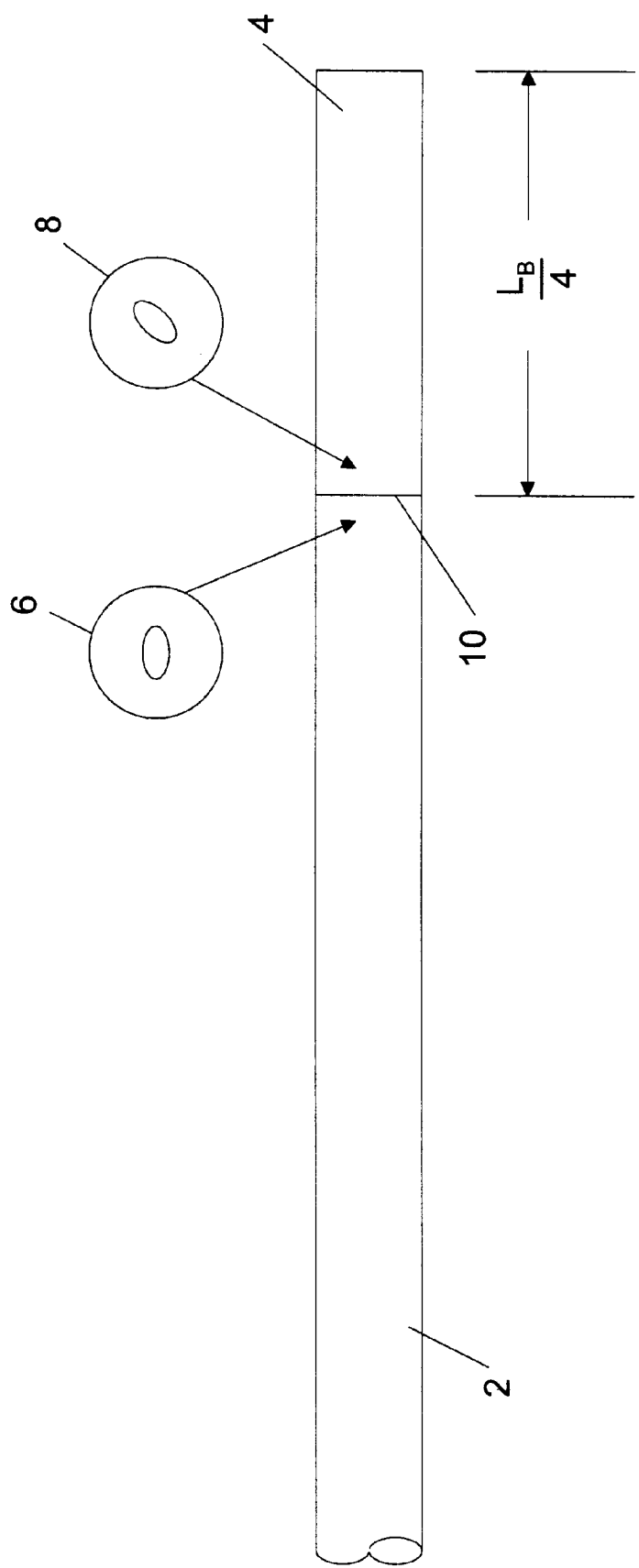
FIG. 1 illustrates the conventional method of fabricating a transformer of linearly to circularly polarized light by splicing two fibers that are properly oriented.

It is often desirable to transform the polarization of a beam of light from one state to another. For this purpose optical devices have been fabricated that input linearly polarized light and output elliptically polarized light. These devices typically function by causing one of two incident linearly polarized light beams to lag behind the other by a pre-selected phase difference. Altering the relative phase of the two incident beams has the effect of changing the state of polarization of the light that exits the optical device. Before considering how these devices of the prior art perform the transformation of linearly to elliptically polarized light and before presenting the detailed description of the preferred embodiment of the present invention, it will be useful to first recall how elliptically polarized light arises.

Two orthogonal electric fields, $E_x$ and $E_y$, both propagating in the z direction can be described by the following two equations $$E_x = i\, E_{0x} \cos(kz - \omega t) \tag{1}$$

and $$E_y = j\, E_{0y} \cos(kz - \omega t + \delta) \tag{2}$$

where i and j are unit vectors in the x and y directions, k is the propagation number, ω is the angular frequency, and δ is the relative phase difference between the two modes. The total electric field E is just given by the vector sum $E_x+E_y$. An observer standing at a fixed point on the z-axis and measuring the components $E_x$ and $E_y$ of the total electric field simultaneously would find that these components would fall on the curve $$(E_x/E_{0x})^2+(E_y/E_{0y})^2-2(E_x/E_{0x})(E_y/E_{0y})\cos\delta=\sin^2\delta. \quad (3)$$

Equation (3) is the well known equation of an ellipse making an angle a with the $(E_x, E_y)$-coordinate system, where $$\tan 2\alpha=(2E_{0x}E_{0y}\cos\delta)\div(E_{0x}^2-E_{0y}^2) \quad (4)$$

Hence, E corresponds to elliptically polarized light. From Equation (3) can be seen that the phase difference $\delta$ dictates some of the characteristics of the ellipse. For example, if $\delta$ were equal to an even multiple of $2\pi$ (i.e., if $E_x$ and $E_y$ are in phase), then Equation (3) reduces to $E_y=(E_{0y}/E_{0x})E_x$, which is the equation of a straight line; in that case, E is linearly polarized. On the other hand, if $\delta$ is equal to $\pm\pi/2$, $\pm3\pi/2$, $\pm5\pi/2$, ..., and assuming $E_{0x}=E_{0y}=E_0$, Equation (3) reduces to $E_{0x}^2+E_{0y}^2=E_0^2$, which is the equation of a circle. In that case, E is circularly polarized. Of course, linearly and circularly polarized light are just special cases of elliptically polarized light, a line and a circle being special types of ellipses.

From the above considerations, it is clear that if two perpendicular modes of light with equal amplitudes, such as that described by Equations (1) and (2) with $E_{0x}=E_{0y}$, enter an optical device, and proceed to exit the device with a phase shift of $\pi/2$, the result would be circularly polarized light. Typical optical devices that serve to transform linearly polarized light to circularly polarized light work on this principle.

For example, birefringent light fibers are anisotropic meaning that they do not have the same optical properties in all directions. Such fibers have the following properties: If two linearly polarized light beams are traveling along the fiber, or along the z axis, and furthermore one beam is polarized along the y axis and the other along the x axis, then, while the beam polarized along the y axis will travel at a speed v, the other beam that is polarized along the x axis will have a different speed. (In a birefringent fiber, the term "optic axis" may refer to either the fast or the slow axis, which are taken here to be the x and y axes, both perpendicular to the propagation axis, taken here to be the z axis.) Such two beams moving perpendicular to an optic axis may enter the fiber in phase, but because of their disparate speeds will exit with a non-zero phase difference 5. The result, as was seen above, is elliptically polarized light.

In the time, $\Delta t$, that it takes the faster moving beam to traverse the birefringent fiber, the faster moving beam, with speed $v_{fast}$, will outpace the slower moving beam, with speed $v_{slow}$, by a distance $(v_{fast}-v_{slow})\Delta t$. This last mentioned distance contains $(v_{fast}-v_{slow})\Delta t/\lambda_{slow}$ waves of the slower moving beam having wavelength $\lambda_{slow}$. Noting that $\Delta t=L/v_{fast}$, where L is the fiber length, the phase difference between the two beams is given by $$\delta=2\pi(v_{fast}-v_{slow})L/(\lambda_{slow}v_{fast}). \quad (5)$$

This last equation can be rewritten by substituting $$v_{fast}=\lambda_{fast}v, \quad (6)$$

and $$v_{slow}=\lambda_{slow}v, \quad (7)$$

where v is the common frequency of the slow and fast beams, to yield $$L=(\delta/2\pi)(1/\lambda_{slow}-1/\lambda_{fast})^{-1} \quad (8)$$

This last equation makes clear that one can tailor a birefringent fiber to act as a transformer of linearly polarized light into elliptically polarized light simply by choosing the correct length, L, of fiber, although this length depends on the frequency of the light through Equations (7) and (8). The length of fiber that results in a phase difference of $2\pi$ and that therefore leaves the polarization unchanged is known as a beatlength, denoted by $L_b$, and will play a role in the discussion below.

The above discussion may be generalized to show that if instead of purely monochromatic light, light containing a spectrum of wavelengths is employed, birefringent fibers may be employed to convert such linearly polarized light to elliptically polarized light, where the degree of polarization of the output light decreases with increasing width of the input spectrum. In addition, the above discussion may be generalized to show that the polarization transformer will convert elliptically polarized light into linearly polarized light, if the light propagates through the fiber in the reverse direction.

To make optical devices that transform linearly polarized light into elliptically polarized light, one may use a birefringent fiber with two beams of light of equal frequency and amplitude (or, equivalently, one beam that is the vector sum of these two beams, since, as is known in the art, a single beam of linearly polarized light may be described as the vector sum of two beams, each with a single linear polarization component; conversely, two linearly polarized beams may be vector summed into a single linearly polarized beam). Alternatively, polarization components of unequal amplitude may be employed. As was discussed above, if the two beams are propagated perpendicular to the x axis, and their polarizations are along x and y axes, elliptically polarized light may result. Alternatively, linearly polarized light may be transformed to circularly polarized light by using one beam and two birefringent fibers, one of which is rotated by 45 degrees with respect to the other about the common propagation axis of the fibers, and of length $L_b/4$.

Referring to FIG. 1, such a single-beam transformer of linearly polarized light to circularly polarized light may be constructed by fusing two silica or glass birefringent fibers. One of these fibers is the transmitting fiber 2 that delivers light to a second birefringent fiber known as the transforming fiber 4. The transforming fiber 4 is cut to a length of $L_b/4$. In addition, the relative orientation of the two fibers is chosen so that the transmitting fiber 2 is rotated $\pi/4$ radians with respect to the transforming fiber, about the common propagation axis of the two fibers, as indicated by the transmitting fiber cross section 6 and the transforming fiber cross section 8. Such a splicing operation may be done with a commercially available fusion splicer. However, any misalignment of the fibers results in some light being lost at the splice 10. Moreover, as Equation 5 makes clear, errors in the phase difference $\delta$ grow linearly with errors in the fiber length L. In practice, constructing a single-beam transformer of linearly to circularly polarized light involves first starting with a length of transforming fiber 4 greater than $L_b/4$, and performing several iterations of cutting and measuring polarization of light emerging from the end of the transforming fiber until the polarization is deemed to be circular to within some specification. Needless to say, this is a tedious and lengthy procedure requiring lots of guesswork.

Figure 2:
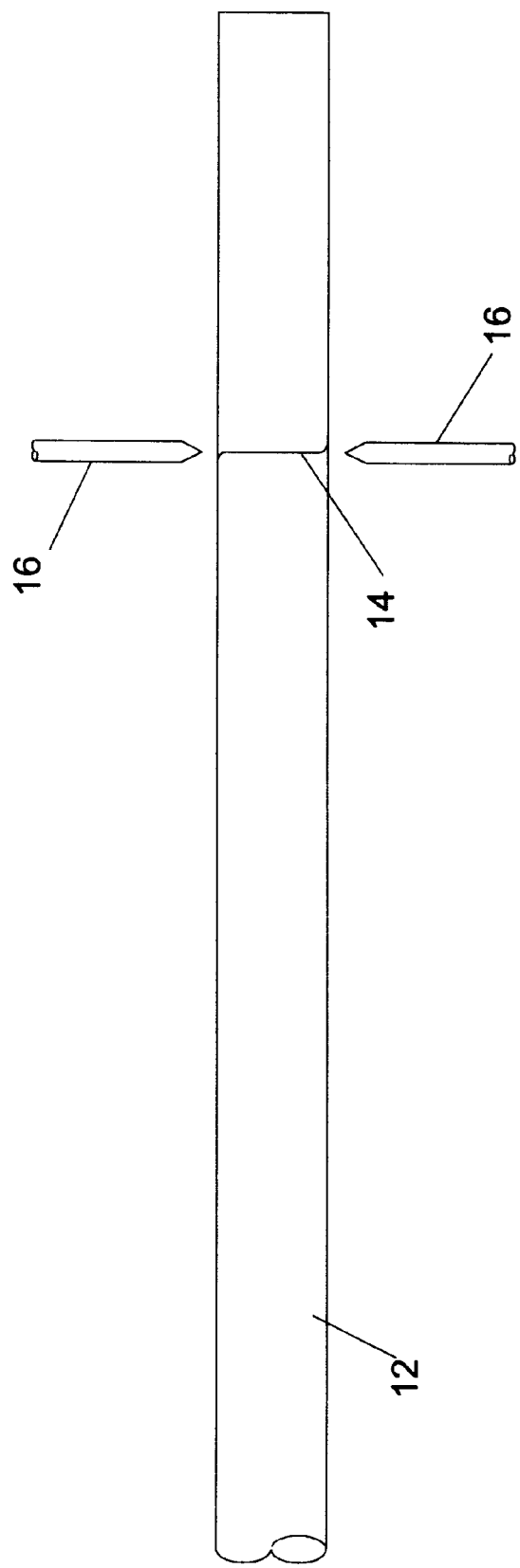
FIG. 2 is a schematic of a twisted fiber of the present invention that obviates the need to splice fibers together.

The present invention resolves some of the aforementioned problems by presenting an alternate method of fabricating a single-beam transformer of polarized light. Referring to FIG. 2, instead of splicing two fibers offset by π/4 radians, in the method of the present invention a single birefringent fiber 12 is twisted about its central axis by this angle. In an alternate embodiment, the fiber may be twisted by an angle of an odd multiple of π/4 radians. The twist 14 in the fiber may be accomplished by heating the birefringent fiber 12 using arc electrodes 16, or other local heat source known to those of skill in the art. This may be done while applying torsion to twist the fiber, using methods known to those of skill in the art.

Figure 3:
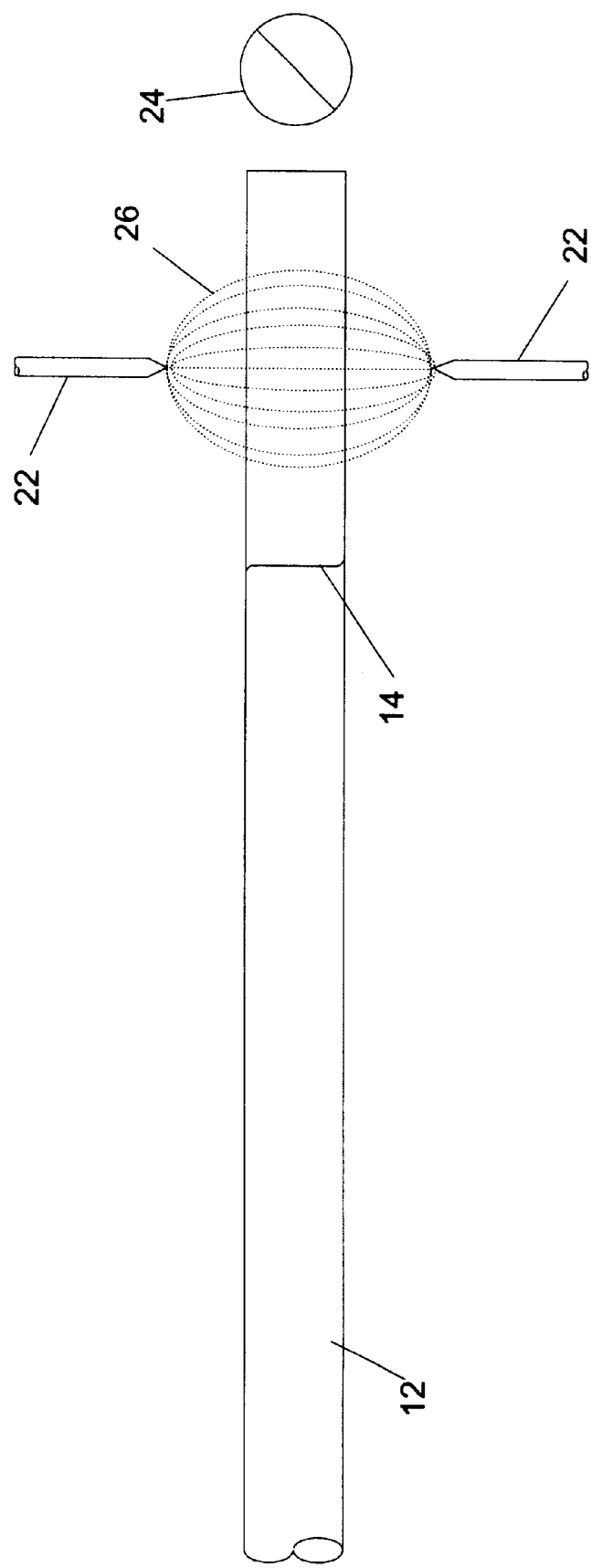
FIG. 3 illustrates how fine tuning of the polarization can be achieved by heating the fiber to cause diffusion of the core into the cladding.

Referring to FIG. 3, in lieu of the tedious iterations of cutting and monitoring, in the method of the present invention, fine tuning is achieved by heating the portion of the fiber beyond the twist with a diffusing arc 26 produced by arc electrodes 22, or other local heat source known to those of skill in the art, to cause diffusion of the fiber core into the cladding. The heating can continue until a polarization monitor 24 indicates that the right polarization state is achieved. The effect of the diffusion is to expand the fields of the fiber modes and so reduce the effective difference $v_{fast}-v_{slow}$, thereby increasing the beat length.

The steps of twisting and diffusing are conceptually independent, and each can be used profitably to make transformers of linearly to elliptically polarized light. Varying the angle through which the birefringent fiber 12 is twisted is tantamount to varying the amplitudes $E_0$, and $E_{0y}$ of Equation (3) and results in different states of elliptically polarized light. The step of diffusing, on the other hand, can be used any time some fine tuning of the polarization is required. For example, after splicing two fibers of appropriate length according to conventional methods, the state of polarization can be fine tuned by causing the core to diffuse into the cladding.

One can also fabricate a transformer using one birefringent fiber and two beams of linearly polarized light. If the two beams are propagated perpendicular to the x axis, and their polarizations are along the x and y axes, elliptically polarized light results. After cutting the single fiber to an appropriate length, fine tuning of the sought-after polarization can be achieved by heating the fiber to cause diffusion of the core into the cladding as mentioned above.

The present invention presents a more convenient method to fabricate a transformer of polarized light. The first step of the method obviates the need to splice a transmitting fiber 2 to a transforming birefringent fiber 4 of length $L_b/4$ with the aim of producing a transformer of linearly to circularly polarized light. Instead, a convenient length of a birefringent fiber 12 is heated to the softening point of the glass and then twisted through an angle of approximately π/4 radians. In some embodiments, an angle approximately equal to an odd multiple of π/4 may be employed. The sense of the output polarization (i.e., whether the light is right- or left-circularly polarized) may be determined by the orientation of the input light's polarization vector with respect to the direction of the twist. In a preferred embodiment, the twisting should occur over as short a length as possible. Employing a twist rather than a splice between two fibers offset by an angle keeps optical losses low. What losses do occur may be scarcely measurable in practice.

In the next step of the invention, fine tuning is performed in the following manner. First, the birefringent fiber 12 is cut so that its length from the twist 14 to the end of the fiber is slightly larger than $L_b/4$. In an alternate embodiment, the length of the fiber after the twist may be approximately equal to an odd multiple of $L_b/4$. The twisted birefringent fiber 12 is positioned between the arc electrodes 22 of a fiber fusion splicer. A diffusing arc 26 may be struck at a current lower than that used for splicing in order to raise the temperature of the birefringent fiber 12 to a point below its melting point, but where the fiber core begins to diffuse into the cladding. The effect of the diffusion is to expand the fields of the fiber modes and so reduce the effective birefringence. The light emerging from the transformer is monitored during this operation with the use of a polarization monitor 24, and diffusion is stopped when the light is circularly polarized. FIG. 3 shows the arrangement.

Although what was described above is a preferred method for fabricating a single-beam transformer of linearly to circularly polarized light by the steps of twisting and diffusing, it should be understood that these two steps are independent and each may be profitably used individually. For example, to form a single-beam transformer of linearly to circularly polarized light, a single birefringent fiber can be twisted as described above, and then fine tuned not by the preferred method of diffusing, but by a conventional method of iterations of cutting the fiber to an appropriate length and monitoring the polarization.

Alternatively, two fibers may be spliced together as in usual approaches. The transforming fiber would then be cut to a length of approximately $L_b/4$. However, unlike the usual methods that then fine tune by iterations of cutting and monitoring, the tuning could proceed by causing the core to diffuse into the cladding, as described above.

Finally, instead of twisting a birefringent fiber through an angle of n/4 radians, which corresponds to choosing $E_{0x}=E_{0y}$ in Equation (3), the fiber could be twisted through varying angles. This would be effectively equivalent to varying the amplitudes $E_{0x}$ and $E_{0y}$. As can be seen from this equation, even if the length of the fiber would lead to a phase difference of π/4 radians, the result would generally be elliptically polarized light that is non-circular.

The above methods have involved fabricating a single-beam transformer of linearly to circularly, or in the case where the twisting angle is not π/4 radians or an odd multiple thereof, elliptically polarized light. As mentioned above, one can also build a transformer using one birefringent fiber and two beams of orthogonally linearly polarized light (of course, two beams of superposed light is equivalent to a single beam equal to the vector sum of the two constituent beams). If the two beams are propagated along the z axis perpendicular to the x axis, and their polarizations are along the x and y axes, elliptically polarized light may result. According to Equations 3, 4, and 5, the type of elliptically polarized light that results depends on the length of the fiber, L. After cutting a birefringent fiber to an appropriate length, fine tuning of the polarization can proceed by diffusing the core into the cladding, as described above.

In a related application of the present invention, the twisting procedure described 15 above may also be used to construct depolarizing fiber. If light having a band of different frequencies enters a fiber with the type of twist described above, after traveling a certain length known as the decoherence length (see Richard B. Dyott, *Elliptical Fiber Waveguides*, Artech House, which is incorporated herein by reference), the emergent light will be randomly polarized even if the light entering the fiber was polarized. Such randomly polarized light may have various applications known to those of ordinary skill in the art.

The transformer of linearly to circularly polarized light described above can be used in a current sensor exploiting the Faraday Effect in a Sagnac interferometer. A main feature of a Sagnac interferometer is a splitting of a beam of light into two beams. By using mirrors or optical fibers, both beams of light are made to traverse at least one loop, but in opposite directions. At the end of the trip around the loop, both beams are recombined thus allowing interference to occur. Any disturbance that affects one or both beams as they are traversing the loop has the potential to alter the interference pattern observed when the beams recombine. Rotating the device is the traditional disturbance associated with Sagnac's name. Another disturbance, giving rise to the Faraday Effect, involves applying an external magnetic field to the medium that forms the loop through which the light travels. Under the influence of such a field, the properties of the light-transmitting medium forming the loop are altered so as to cause a change in the direction of polarization of the light. In turn, this change in the direction of polarization results in a change in the interference pattern observed. These types of disturbances that give rise to a modification in the observed interference pattern are known as non-reciprocal disturbances. They are so-called because, unlike reciprocal effects in which the change produced in one beam cancels with that produced in the other, the changes produced in the two beams reinforce to yield a modification in the resultant interference pattern.

There is therefore in place a technique for measuring the current through a conductor: as a consequence of the Biot-Savart Law, an infinitely long conducting wire, for example, carrying a current i, gives rise to a magnetic field whose magnitude at a distance R from the wire is $\mu_0$ i÷($2\pi$R), where $\mu_0$ is the permeability of free space. If the Sagnac interferometer described above is immersed in this magnetic field, the properties of the fiber that composes the coil will change so as to affect the interference pattern observed. Thus, from the change in this pattern, the current i can be inferred. Similar current sensors are known in the prior art, e.g., Interferometer device for measurement of magnetic fields and electric current pickup comprising a device, U.S. Pat. No. 4,560,867, naming Papuchon; Michel; Arditty; Herve; Puech; Claude as inventors, which is incorporated by reference herein. The design of current sensors is similar to that of fiber optic rotation sensors of the type that appears in Fiber Optic Rotation Sensor or Gyroscope with Improved Sensing Coil, U.S. Pat. No. 5,552,887, naming Dyott, Richard B. as inventor, which is incorporated by reference herein.

It will be understood by those of ordinary skill in the art, that perfectly linearly or circularly polarized light may be an idealization that can not be realized. I.e., in practice, there may exist uncontrollable factors that give rise to some deviations from perfectly linearly or circularly polarized light. Therefore, it should be understood that when reference is made to linearly or circularly polarized light the meaning of these terms should be taken to mean effectively or approximately linearly or circularly polarized light.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A method of fabricating a transformer of polarized light, comprising:
   a) twisting a birefringent fiber, having two ends, about its central axis through an angle approximately equal to an odd multiple of $\pi/4$ radians, at a distance of slightly more than a preselected multiple of a beatlength from a first end of the fiber;
   b) shining light substantially of a preselected first state of polarization through a preselected end of the fiber; and
   c) fine tuning the polarization of the light exiting an end of the fiber opposite the preselected end by heating the fiber between the twist and the first end, so as to cause the core to diffuse into the cladding, until the exiting light is substantially of a preselected second state of polarization.

2. The method of fabricating a transformer of claim 1, wherein the odd multiple of $\pi/4$ radians is 1.

3. The method of fabricating a transformer of claim 1, wherein the birefringent fiber is twisted while being heated near the location of the twist.

4. The method of fabricating a transformer of claim 1, wherein the birefringent fiber is twisted after having been heated near the location of the twist.

5. The method of fabricating a transformer of claim 1, wherein the preselected first state of polarization is linear, the preselected end of the fiber is the second end, and the preselected second state of polarization is elliptical with a preselected eccentricity.

6. The method of fabricating a transformer of claim 1, wherein the preselected first state of polarization is linear, the preselected end of the fiber is the second end, and the preselected second state of polarization is circular.

7. The method of fabricating a transformer of claim 6, wherein the preselected multiple of a beatlength is ¼.

8. The method of fabricating a transformer of claim 1, wherein the preselected first state of polarization is elliptical with a preselected eccentricity, the preselected end of the fiber is the first end, and the preselected second state of polarization is linear.

9. The method of fabricating a transformer of claim 1, wherein the preselected first state of polarization is circular, the preselected end of the fiber is the first end, and the preselected second state of polarization is linear.

10. The method of fabricating a transformer of claim 9, wherein the preselected multiple of a beatlength is ¼.

11. A method of fabricating a transformer of polarized light, comprising:
    a) twisting a birefringent fiber, having two ends, through an angle approximately equal to an odd multiple of $\pi/4$ radians into a corkscrew shape, at a distance of slightly more than a preselected multiple of a beatlength from a first end of the fiber;
    b) shining light substantially of a preselected first state of polarization through a preselected end of the fiber; and
    c) fine tuning the polarization of the light exiting an end of the fiber opposite the preselected end by heating the fiber between the twist and the first end, so as to cause the core to diffuse into the cladding, until the exiting light is substantially of a preselected second state of polarization.

12. The method of fabricating a transformer of claim 11, wherein the odd multiple of $\pi/4$ radians is 1.

13. The method of fabricating a transformer of claim 11, wherein the birefringent fiber is twisted while being heated near the location of the twist.

14. The method of fabricating a transformer of claim 11, wherein the birefringent fiber is twisted after having been heated near the location of the twist.

15. The method of fabricating a transformer of claim 11, wherein the preselected first state of polarization is linear, the preselected end of the fiber is the second end, and the preselected second state of polarization is elliptical with a preselected eccentricity.

16. The method of fabricating a transformer of claim 11, wherein the preselected first state of polarization is linear, the preselected end of the fiber is the second end, and the preselected second state of polarization is circular.

17. The method of fabricating a transformer of claim 16, wherein the preselected multiple of a beatlength is ¼.

18. The method of fabricating a transformer of claim 11, wherein the preselected first state of polarization is elliptical with a preselected eccentricity, the preselected end of the fiber is the first end, and the preselected second state of polarization is linear.

19. The method of fabricating a transformer of claim 11, wherein the preselected first state of polarization is circular, the preselected end of the fiber is the first end, and the preselected second state of polarization is linear.

20. The method of fabricating a transformer of claim 19, wherein the preselected multiple of a beatlength is ¼.

21. A method of transforming substantially linearly polarized light into substantially elliptically polarized light, comprising:
a) twisting a birefringent fiber, having two ends, through an angle approximately equal to an odd multiple of $\pi/4$ radians to produce a corkscrew shape, at a distance of slightly more than a preselected multiple of a beatlength from a first end of the fiber;
b) shining substantially linearly polarized light through a second end of the fiber; and
c) fine tuning the polarization of the light exiting the first end of the fiber by heating the fiber between the twist and the first end, so as to cause the core to diffuse into the cladding, until the exiting light is substantially elliptically polarized with a preselected eccentricity.

22. The method of transforming substantially linearly polarized light into substantially elliptically polarized light of claim 21, wherein the odd multiple of $\pi/4$ radians is 1.

23. The method of transforming substantially linearly polarized light into substantially elliptically polarized light of claim 21, wherein the elliptically polarized light is circularly polarized.

24. The method of transforming substantially linearly polarized light into substantially elliptically polarized light of claim 23, wherein the preselected multiple of a beatlength is an odd multiple of one quarter.

25. The method of transforming substantially linearly polarized light into substantially elliptically polarized light of claim 21, wherein the birefringent fiber is twisted while being heated near the location of the twist.

26. The method of transforming substantially linearly polarized light into substantially elliptically polarized light of claim 21, wherein the birefringent fiber is twisted after having been heated near the location of the twist.

27. A method of transforming substantially elliptically polarized light into substantially linearly polarized light, comprising:
a) twisting a birefringent fiber, having two ends, through an angle approximately equal to an odd multiple of $\pi/4$ radians to produce a corkscrew shape, at a distance of slightly more than a preselected multiple of a beatlength from a first end of the fiber;
b) shining substantially elliptically polarized light with a preselected eccentricity through a first end of the fiber; and
c) fine tuning the polarization of the light exiting the second end of the fiber by heating the fiber between the twist and the first end, so as to cause the core to diffuse into the cladding, until the exiting light is substantially linearly polarized.

28. The method of transforming substantially elliptically polarized light into substantially linearly polarized light of claim 27, wherein the odd multiple of $\pi/4$ radians is 1.

29. The method of transforming substantially elliptically polarized light into substantially linearly polarized light of claim 27, wherein the elliptically polarized light is circularly polarized.

30. The method of transforming substantially elliptically polarized light into substantially linearly polarized light of claim 29, wherein the preselected multiple of a beatlength is an odd multiple of one quarter.

31. The method of transforming substantially elliptically polarized light into substantially linearly polarized light of claim 27, wherein the birefringent fiber is twisted while being heated near the location of the twist.

32. The method of transforming substantially elliptically polarized light into substantially linearly polarized light of claim 27, wherein the birefringent fiber is twisted after having been heated near the location of the twist.

33. A method of transforming substantially linearly polarized light into substantially elliptically polarized light, comprising:
a) twisting a birefringent fiber, having two ends, about its central axis through an angle approximately equal to an odd multiple of $\pi/4$ radians, at a distance of slightly more than a preselected multiple of a beatlength from a first end of the fiber;
b) shining substantially linearly polarized light through a second end of the fiber; and
c) fine tuning the polarization of the light exiting the first end of the fiber by heating the fiber between the twist and the first end, so as to cause the core to diffuse into the cladding, until the exiting light is substantially elliptically polarized with a preselected eccentricity.

34. The method of transforming substantially linearly polarized light into substantially elliptically polarized light of claim 33, wherein the odd multiple of $\pi/4$ radians is 1.

35. The method of transforming substantially linearly polarized light into substantially elliptically polarized light of claim 33, wherein the birefringent fiber is twisted while being heated near the location of the twist.

36. The method of transforming substantially linearly polarized light into substantially elliptically polarized light of claim 33, wherein the birefringent fiber is twisted after having been heated near the location of the twist.

37. A method of transforming substantially elliptically polarized light into substantially linearly polarized light, comprising:
a) twisting a birefringent fiber, having two ends, about its central axis through an angle approximately equal to an odd multiple of $\pi/4$ radians, at a distance of slightly more than a preselected multiple of a beatlength from a first end of the fiber;
b) shining substantially elliptically polarized light with a preselected eccentricity through a first end of the fiber; and
c) fine tuning the polarization of the light exiting the second end of the fiber by heating the fiber between the twist and the first end, so as to cause the core to diffuse into the cladding, until the exiting light is substantially linearly polarized.

38. The method of transforming substantially elliptically polarized light into substantially linearly polarized light of claim 37, wherein the odd multiple of $\pi/4$ radians is 1.

39. The method of transforming substantially elliptically polarized light into substantially linearly polarized light of claim 37, wherein the elliptically polarized light is circularly polarized.

40. The method of transforming substantially elliptically polarized light into substantially linearly polarized light of claim 39, wherein the preselected multiple of a beatlength is one quarter.

41. The method of transforming substantially elliptically polarized light into substantially linearly polarized light of claim 37, wherein the birefringent fiber is twisted while being heated near the location of the twist.

42. The method of transforming substantially elliptically polarized light into substantially linearly polarized light of claim 37, wherein the birefringent fiber is twisted after having been heated near the location of the twist.

43. A transformer of light between substantially elliptical and substantially linear polarization states, comprising a birefringent fiber, having two ends, twisted about its central axis through an angle approximately equal to an odd multiple of $\pi/4$ radians, at a distance of slightly more than a preselected multiple of a beatlength from a first end of the fiber, wherein:
   a) the fiber contains a core which runs lengthwise through the fiber surrounded by a cladding, and
   b) a portion of the core between the twist and a first end of the fiber has diffused into a portion of the cladding surrounding it.

44. The transformer of claim 43, wherein the odd multiple of $\pi/4$ radians is 1.

45. The transformer of claim 43, wherein the preselected multiple of a beatlength is an odd multiple of one quarter.

46. The transformer of claim 45, wherein the odd multiple of one quarter is 1.

47. The transformer of claim 43, wherein the portion of the core diffuses into the portion of the cladding surrounding it by the application of heat to the portion of the fiber between the first end and the twist, which heat is applied until substantially linearly polarized light entering a second end of the fiber exits the first end substantially elliptically polarized with a preselected eccentricity.

48. The transformer of claim 43, wherein the portion of the core diffuses into the portion of the cladding surrounding it by the application of heat to the portion of the fiber between the first end and the twist, which heat is applied until substantially elliptically polarized light with a preselected eccentricity entering a first end of the fiber exits the second end substantially linearly polarized.

49. The transformer of claim 43, wherein the twist in the birefringent fiber is formed by twisting the fiber while it is being heated near the location of the twist.

50. The transformer of claim 43, wherein the twist in the birefringent fiber is formed by twisting the fiber after it has been heated near the location of the twist.

51. A transformer of light between substantially elliptical and substantially linear polarization states, comprising a birefringent fiber, having two ends, twisted through an angle approximately equal to an odd multiple of $\pi/4$ radians into a corkscrew shape, at a distance of slightly more than a preselected multiple of a beatlength from a first end of the fiber, wherein:
   a) the fiber contains a core which runs lengthwise through the fiber surrounded by a cladding, and
   b) a portion of the core between the twist and a first end of the fiber has diffused into a portion of the cladding surrounding it.

52. The transformer of claim 51, wherein the odd multiple of $\pi/4$ radians is 1.

53. The transformer of claim 51, wherein the preselected multiple of a beatlength is an odd multiple of one quarter.

54. The transformer of claim 53, wherein the odd multiple of one quarter is 1.

55. The transformer of claim 51, wherein the portion of the core diffuses into the portion of the cladding surrounding it by the application of heat to the portion of the fiber between the first end and the twist, which heat is applied until substantially linearly polarized light entering a second end of the fiber exits the first end substantially elliptically polarized with a preselected eccentricity.

56. The transformer of claim 51, wherein the portion of the core diffuses into the portion of the cladding surrounding it by the application of heat to the portion of the fiber between the first end and the twist, which heat is applied until substantially elliptically polarized light with a preselected eccentricity entering a first end of the fiber exits the second end substantially linearly polarized.

57. The transformer of claim 51, wherein the twist in the birefringent fiber is formed by twisting the fiber while it is being heated near the location of the twist.

58. The transformer of claim 51, wherein the twist in the birefringent fiber is formed by twisting the fiber after it has been heated near the location of the twist.

59. A method of fabricating a transformer of polarized light, comprising:
   a) splicing a first end of a first birefringent fiber, having a central axis and two ends, to a second end of a second birefringent fiber, having a central axis and two ends, and having a length of slightly more than a preselected multiple of a beatlength, where the central axis of the second birefringent fiber is rotated through an angle approximately equal to an odd multiple of $\pi/4$ radians with respect to the central axis of the first birefringent fiber;
   b) shining substantially linearly polarized light through the second end of the first fiber; and
   c) fine tuning the polarization of the light exiting the first end of the second fiber by heating the second fiber, so as to cause the core to diffuse into the cladding, until the exiting light is substantially elliptically polarized with a preselected eccentricity.

60. The method of fabricating a transformer of claim 59, wherein the odd multiple of $\pi/4$ radians is 1.

61. The method of fabricating a transformer of claim 59, wherein the preselected multiple of a beatlength is an odd multiple of one quarter.

62. The method of fabricating a transformer of claim 61, wherein the odd multiple of one quarter is 1.

63. A method of fabricating a transformer of polarized light, comprising:
   a) splicing a first end of a first birefringent fiber, having a central axis and two ends, to a second end of a second birefringent fiber, having a central axis and two ends, and having a length of slightly more than a preselected multiple of a beatlength, where the central axis of the second birefringent fiber is rotated through an angle approximately equal to an odd multiple of $\pi/4$ radians with respect to the central axis of the first birefringent fiber;
   b) shining substantially elliptically polarized light through the first end of the second fiber; and
   c) fine tuning the polarization of the light exiting the second end of the first fiber by heating the second fiber, so as to cause the core to diffuse into the cladding, until the exiting light is substantially linearly polarized.

64. The method of fabricating a transformer of claim 63, wherein the odd multiple of $\pi/4$ radians is 1.

65. The method of fabricating a transformer of claim 63, wherein the preselected multiple of a beatlength is an odd multiple of one quarter.

66. The method of fabricating a transformer of claim 65, wherein the odd multiple of one quarter is 1.

67. A method of transforming substantially linearly polarized light into substantially elliptically polarized light, comprising:

a) splicing a first end of a first birefringent fiber, having a central axis and two ends, to second end of a second birefringent fiber, having a central axis and two ends, and having a length of slightly more than a specified multiple of a beatlength, where the central axis of the second birefringent fiber is rotated through an angle approximately equal to an odd multiple of $\pi/4$ radians with respect to the central axis of the first birefringent fiber;

b) shining substantially linearly polarized light through the second end of the first fiber; and c) fine tuning the polarization of the light exiting the first end of the second fiber by heating the second fiber, so as to cause the core to diffuse into the cladding, until the exiting light is substantially elliptically polarized with a preselected eccentricity.

68. The method of transforming substantially linearly polarized light into substantially elliptically polarized light of claim 67, wherein the odd multiple of $\pi/4$ radians is 1.

69. The method of transforming substantially linearly polarized light into substantially elliptically polarized light of claim 67, wherein the specified multiple of a beatlength is an odd multiple of one quarter.

70. The method of transforming substantially linearly polarized light into substantially elliptically polarized light of claim 69, wherein the odd multiple of one quarter is 1.

71. A method of transforming substantially elliptically polarized light into substantially linearly polarized light, comprising:

a) splicing a first end of a first birefringent fiber, having a central axis and two ends, to a second end of a second birefringent fiber, having a central axis and two ends, and having a length of slightly more than a specified multiple of a beatlength, where the central axis of the second birefringent fiber is rotated through an angle approximately equal to an odd multiple of $\pi/4$ radians with respect to the central axis of the first birefringent fiber;

b) shining substantially elliptically polarized light with a preselected eccentricity through the first end of the second fiber; and c) fine tuning the polarization of the light exiting the second end of the first fiber by heating the second fiber, so as to cause the core to diffuse into the cladding, until the exiting light is substantially linearly polarized.

72. The method of transforming substantially elliptically polarized light into substantially linearly polarized light of claim 71, wherein the odd multiple of $\pi/4$ radians is 1.

73. The method of transforming substantially elliptically polarized light into substantially linearly polarized light of claim 71, wherein the specified multiple of a beatlength is an odd multiple of one quarter.

74. The method of transforming substantially linearly polarized light into substantially elliptically polarized light of claim 73, wherein the odd multiple of one quarter is 1.

75. A transformer of light between substantially linear and substantially elliptical polarization states, comprising a) a first birefringent fiber, having a central axis and two ends, containing a core which runs lengthwise through the fiber surrounded by a cladding; and b) a second birefringent fiber, having a central axis and two ends, containing a core which runs lengthwise through the fiber surrounded by a cladding, and having a length of slightly more than a preselected multiple of a beatlength, where the central axis of the second birefringent fiber is rotated through an angle approximately equal to an odd multiple of $\pi/4$ radians with respect to the central axis of the first birefringent fiber, and the first end of the second birefringent fiber is spliced to the second end of the first birefringent fiber, and where a portion of the core in the second fiber has diffused into a portion of the cladding surrounding it.

76. The transformer of claim 75, wherein the odd multiple of $\pi/4$ radians is 1.

77. The transformer of claim 75, wherein the preselected multiple of a beatlength is an odd multiple of one quarter.

78. The transformer of claim 77, wherein the odd multiple of one quarter is 1.

79. The transformer of claim 75, wherein the portion of the core diffuses into the portion of the cladding surrounding it by the application of heat to the second fiber, which heat is applied until substantially linearly polarized light entering a second end of the first fiber exits the first end of the second fiber substantially elliptically polarized with a preselected eccentricity.

80. The transformer of claim 75, wherein the portion of the core diffuses into the portion of the cladding surrounding it by the application of heat to the second fiber, which heat is applied until substantially elliptically polarized light with a preselected eccentricity entering a first end of the second fiber exits the second end of the first fiber substantially linearly polarized.

* * * * *